(12) United States Patent
Katyal

(10) Patent No.: US 9,991,896 B2
(45) Date of Patent: Jun. 5, 2018

(54) PHASE LOCKED LOOP CIRCUIT WITH CHARGE PUMP UP-DOWN CURRENT MISMATCH ADJUSTMENT AND STATIC PHASE ERROR REDUCTION

(71) Applicant: Synopsys, Inc., Mountain View, CA (US)

(72) Inventor: Amit Katyal, Ghaziabad (IN)

(73) Assignee: Synopsys, Inc., Mountain View, CA (US)

( * ) Notice: Subject to any disclaimer, the term of this patent is extended or adjusted under 35 U.S.C. 154(b) by 0 days. days.

(21) Appl. No.: 15/668,392

(22) Filed: Aug. 3, 2017

(65) Prior Publication Data

US 2018/0048322 A1 Feb. 15, 2018

Related U.S. Application Data

(60) Provisional application No. 62/372,401, filed on Aug. 9, 2016.

(51) Int. Cl.
*H03L 7/06* (2006.01)
*H03L 7/089* (2006.01)
*H03L 7/107* (2006.01)
*H03L 7/097* (2006.01)
*H03L 7/099* (2006.01)

(52) U.S. Cl.
CPC .......... *H03L 7/0891* (2013.01); *H03L 7/0896* (2013.01); *H03L 7/097* (2013.01); *H03L 7/099* (2013.01); *H03L 7/1072* (2013.01)

(58) Field of Classification Search
USPC .................................. 327/147–149, 156–158
See application file for complete search history.

(56) References Cited

U.S. PATENT DOCUMENTS

| 7,009,432 | B2 | 3/2006 | Beghein | |
| 7,634,038 | B1 * | 12/2009 | Hufford | H03K 9/06 375/215 |
| 2002/0149398 | A1 * | 10/2002 | Ingino, Jr. | G05F 1/575 327/52 |
| 2002/0149407 | A1 * | 10/2002 | Ingino, Jr. | H03K 3/0315 327/157 |

(Continued)

*Primary Examiner* — Adam Houston
(74) *Attorney, Agent, or Firm* — Bever, Hoffman & Harms, LLP

(57) ABSTRACT

A magnitude difference between intrinsic positive and negative current components forming a PLL's charge pump output current is determined by simultaneously outputting the intrinsic positive and negative pump current components, and incrementally increasing a bias current added to one of the intrinsic current components (e.g., such that the total positive current component is gradually increased). Calibration control voltages generated by the calibration pump output current are measured to determine when magnitudes of the adjusted (e.g., positive) current component and the non-adjusted/intrinsic (e.g., negative) current component are equal, and the bias current amount required to achieve equalization is stored as a digital converter code. During subsequent normal PLL operations, the digital converter code is utilized to control the charge pump such that the magnitude of the positive current component is adjusted by the bias current amount such that the positive and negative current components are matched.

20 Claims, 8 Drawing Sheets

(56) References Cited

U.S. PATENT DOCUMENTS

| | | | |
|---|---|---|---|
| 2002/0149433 A1* | 10/2002 | Ingino, Jr. | H03K 3/0315 331/57 |
| 2005/0073369 A1* | 4/2005 | Balboni | H03C 3/0925 331/16 |
| 2005/0162200 A1* | 7/2005 | Haerle | H03L 7/0812 327/157 |
| 2005/0221780 A1* | 10/2005 | Chien | H03L 7/0895 455/264 |
| 2006/0044031 A1* | 3/2006 | Cheung | H03L 7/0896 327/157 |
| 2007/0035348 A1* | 2/2007 | Self | H03L 7/0812 331/16 |
| 2007/0049234 A1* | 3/2007 | McCorkle | H03G 3/3052 455/313 |
| 2007/0229127 A1* | 10/2007 | Tirumalai | H03L 7/0893 327/156 |
| 2008/0169853 A1* | 7/2008 | Park | H03L 7/0812 327/158 |
| 2009/0160560 A1* | 6/2009 | Song | H03L 7/0893 331/17 |
| 2010/0074037 A1* | 3/2010 | Lin | G11C 7/20 365/194 |
| 2011/0254615 A1* | 10/2011 | Raghunathan | H03L 7/0896 327/536 |
| 2012/0290145 A1* | 11/2012 | Joshi | H02J 3/385 700/298 |
| 2012/0319786 A1* | 12/2012 | Kumar | H03L 7/0896 331/1 R |
| 2014/0091954 A1* | 4/2014 | Zhu | H02M 3/06 341/110 |
| 2015/0109029 A1* | 4/2015 | Lia | H03L 7/097 327/105 |
| 2016/0308538 A1* | 10/2016 | Goltman | H03L 7/085 |
| 2017/0358329 A1* | 12/2017 | Goumballa | G05F 1/10 |
| 2018/0048322 A1* | 2/2018 | Katyal | H03L 7/0891 |

* cited by examiner

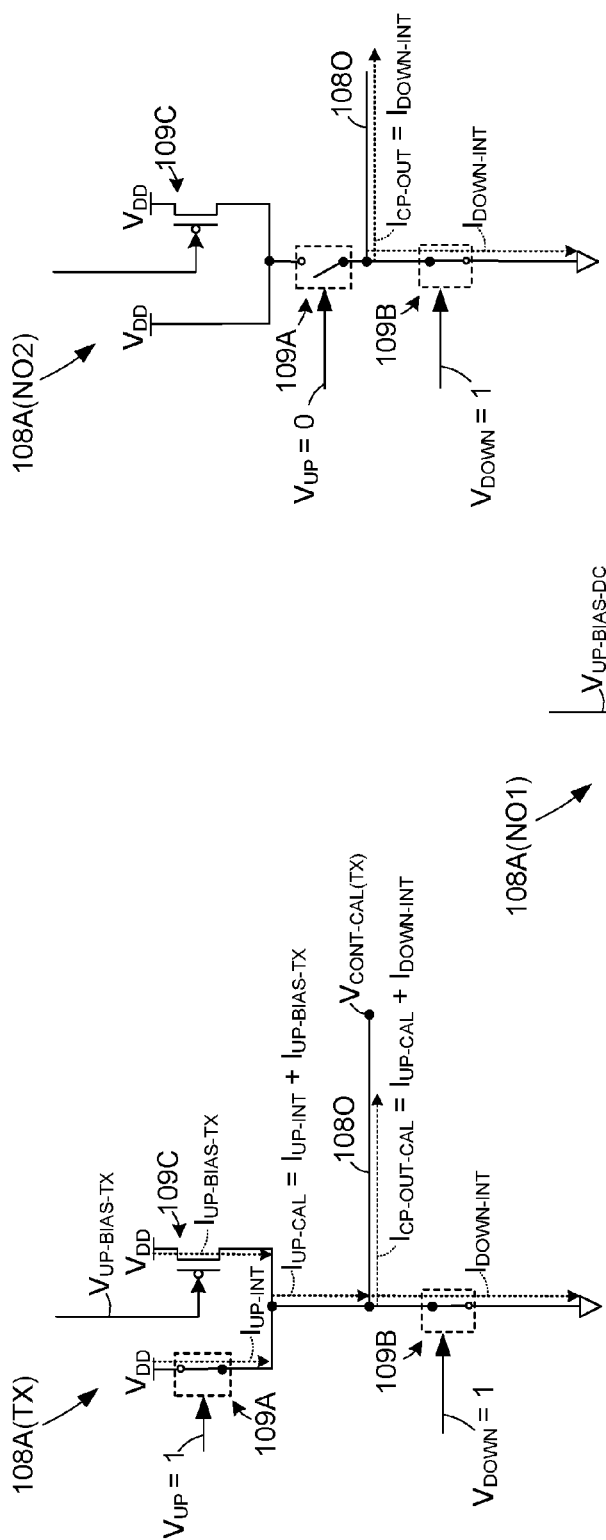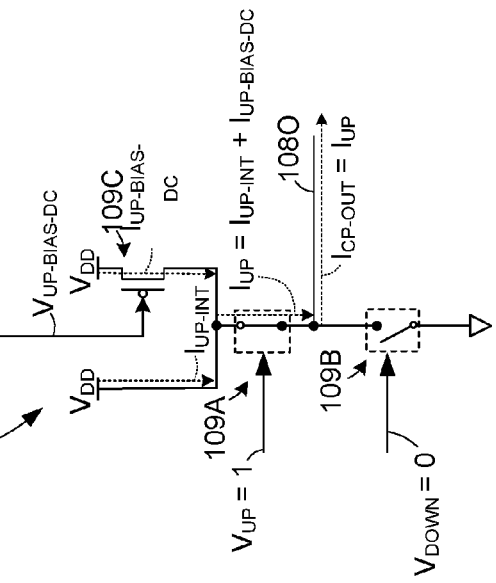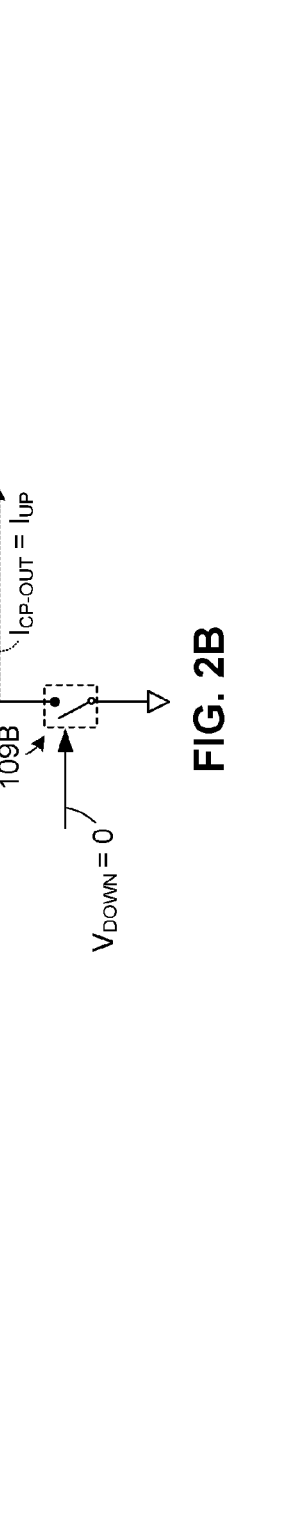
FIG. 2A
FIG. 2B
FIG. 2C

PHASE LOCKED LOOP CIRCUIT WITH CHARGE PUMP UP-DOWN CURRENT MISMATCH ADJUSTMENT AND STATIC PHASE ERROR REDUCTION

RELATED APPLICATIONS

This application claims priority from U.S. Provisional Patent Application 62/372,401, entitled "PHASE LOCKED LOOP CIRCUIT WITH CHARGE PUMP UP-DOWN CURRENT MISMATCH ADJUSTMENT", which was filed on Aug. 9, 2016, and is incorporated by reference herein.

FIELD OF THE INVENTION

This invention generally relates to integrated circuits, and more particularly to phase-locked loop circuits that are incorporated into integrated circuits.

BACKGROUND OF THE INVENTION

A phase-locked loop (PLL) is an electronic circuit with a voltage or voltage-driven oscillator that constantly adjusts to match the frequency of an input signal. PLLs are often incorporated into integrated circuit (IC) devices, and are often used in systems utilizing two clock signals to help align the two clock signals.

Referring to FIG. 7A, a conventional PLL circuit 50 includes a phase frequency detector (PFD) 54 that outputs pump control voltages $V_{UP}$ and $V_{DOWN}$ having values based on the phase difference between an input signal frequency $F_{INF}$ and a feedback signal frequency $F_{FB}$, a charge pump 58 that generates an output current $I_{CP\text{-}OUT}$ in accordance with the pump control voltages that produces a charge stored on a loop filter 64, thereby converting the phase difference between $F_{INF}$ and $F_{FB}$ to a controlled voltage ($V_{CONT}$). A voltage controlled oscillator (VCO) 52 generates a PLL output signal OUTF having a frequency $F_{VCO}$ determined by the voltage level of controlled voltage $V_{CONT}$. A digital divider 60 divides output signal frequency $F_{VCO}$ by a predetermined integer or fractional value N to generate a feedback signal FB. Level shifters 56 may be utilized to match the voltage levels of an input signal INF and the feedback signal FB generated by loop divider 60, whereby input signal frequency $F_{INF}$ and feedback signal frequency $F_{FB}$ supplied to PFD 54 have properly matched voltage levels.

FIG. 7B is a timing diagram indicating the relationship between pump control voltages $V_{UP}$ and $V_{DOWN}$ generated by PFD 54 and the operation of charge pump 58. Referring to FIG. 7A, charge pump 58 generally utilizes a pull-up (e.g., PMOS) transistor 59A controlled by pump control signal $V_{UP}$ and a pull-down (e.g., NMOS) transistor 59B controlled by pump control signal $V_{DOWN}$ to either increase, maintain or decrease controlled voltage $V_{CONT}$. As indicated between times T1 and T3 in FIG. 7B, when the phase of the feedback signal frequency $F_{FB}$ lags the phase of the input signal frequency $F_{INF}$ ($F_{INF}>F_{FB}$), PFD 54 asserts pump control voltage $V_{UP}$ at a low voltage level and output control voltage $V_{DOWN}$ at a high voltage level such that the pull-down NMOS transistor 59B is turned off and the pull-up PMOS transistor 59A is turned on, thereby coupling the output terminal of charge pump 58 to system voltage $V_{DD}$ such that output current $I_{CP\text{-}OUT}$ has a positive (UP) current value determined by positive current component $I_{UP}$. The positive output current $I_{CP\text{-}OUT}$ then increases the controlled voltage $V_{CONT}$ at the output of the charge pump 58 by increasing the charge stored on loop filter (capacitive circuit) 64, which in turn causes VCO 52 to increase the output signal frequency $F_{VCO}$ of output signal OUTF. Conversely, as indicated between times T0 and T1 and between times T3 and T4 in FIG. 7B, when the feedback signal frequency $F_{FB}$ leads the phase of the input signal frequency $F_{INF}$, PFD 54 generates pump control voltages $V_{UP}$ and $V_{DOWN}$ such that pull-down NMOS transistor 59B is turned on and pull-up PMOS transistor 59A is turned off, whereby the output terminal of charge pump 58 is coupled to ground and pump output current $I_{CP\text{-}OUT}$ has a negative (DOWN) current value determined by negative current value $I_{DOWN}$. The negative output current $I_{CP\text{-}OUT}$ then decreases controlled voltage $V_{CONT}$ by discharging a portion of the charge stored on the capacitive circuit 64, which in turn causes VCO 52 to decrease the output signal frequency $F_{VCO}$ of output signal OUTF. In this manner output frequency $F_{VCO}$ is continuously adjusted until the phases of input signal frequency $F_{INF}$ and the feedback clock signal frequency $F_{FB}$ align (match), whereby, as indicated between times T4 and T5 in FIG. 7B, pump control voltages $V_{UP}$ and $V_{DOWN}$ are generated such that both pull-up PMOS transistor 59A and pull-down NMOS transistor 59B are turned off, whereby the controlled voltage $V_{CONT}$ is maintained at its current voltage level, in turn causing the VCO 52 to generate output signal OUTF at signal frequency $F_{VCO}$ corresponding to the matched phases.

A problem with the conventional approach is that, due to various factors, the magnitude of the positive current corresponding to the UP current component $I_{UP}$ generated during leading periods becomes mismatched with the magnitude of the negative current corresponding to the DOWN current component $I_{DOWN}$ generated during the lagging periods. That is, the average charges accumulated on the loop filter 64 due to the UP and DOWN currents (average charge=current*time) become mismatched, for example, due to the finite output resistance of the pull-up and pull-down current sources utilized to generate the UP and DOWN currents, variation of controlled voltage $V_{CONT}$ over time, controlled voltage and temperature variations over time, time delay differences between the UP and DOWN currents, and charge injection and charge coupling phenomena that take place inside the charge pump 58. Referring to FIG. 7B, this mismatch is illustrated by way of depicting DOWN current component $I_{DOWN}$ as having a larger magnitude of 3.5 μA (i.e., the absolute value of −3.5 μA) than the magnitude of UP current $I_{UP}$ (i.e., 3 μA).

The mismatch between the UP current component $I_{UP}$ and the DOWN current component $I_{DOWN}$ result in spurious electrical effects (spurs) which cause phase errors between the input signal frequency $F_{INF}$ and the feedback signal frequency $F_{FB}$. This phase error is called static phase error. In a fractional PLL in which the loop divider 60 divides output frequency $F_{VCO}$ by fractional number N to generate the feedback signal frequency $F_{FB}$, this mismatch is highly undesirable as due to the non-linearity in the charge pump 58, spurs are produced at lower frequencies in-band, which worsens the integrated jitter of PLL 50.

Some prior attempts to address mismatches in the charge pump 58 include increases the output impedance of the source and sink current sources utilized to generate the UP and DOWN current components using impedance boosting architectures such as cascoding. This solution may be impractical when conventional PLL 50 operates at lower voltages and/or wide band frequencies. Another conventional mitigation approach involves reducing offsets in the UP and DOWN current paths between the phase frequency detector 54 and the charge pump 58 with careful layout design. Charge injection and charge coupling are difficult to mitigate, although TX gates (transmission gates, electronic components that will selectively block or pass a signal level from the input to the output) are sometimes used for this purpose.

In U.S. Pat. No. 7,009,432, entitled "Self-calibrating phase locked loop charge pump system and method", a circuit is described to reduce current mismatch between the UP and DOWN currents. However, the circuit does not cancel the timing mismatch between the UP and DOWN paths in the combined phase frequency detector 54 and charge pump 58 circuit block.

What is needed is a PLL circuit and an associated operating method that addresses the problems associated with conventional PLLs that are set forth above.

SUMMARY OF THE INVENTION

The present invention is directed to a phase-locked loop (PLL) circuit and associated operating method that determines differences between the magnitudes of intrinsic (unmodified) positive and negative current components generated by the PLL circuit's charge pump, and adjusts the operating state of the PLL circuit's charge pump during subsequent normal PLL operations such that one of the two intrinsic current components is combined with a bias current amount that is equal to the determined magnitude difference, whereby the combined/modified (e.g., positive) current component matches the unmodified (e.g., negative) current component. By determining and utilizing the bias current amount to eliminate magnitude differences between the positive and negative current components forming the charge pump's output current, PLL circuits formed in accordance with the present invention avoid spurious electrical effects that are associated with PLL's using conventional (non-adjustable) charge pumps.

According to a generalized embodiment of the invention, a PLL circuit includes a phase frequency detector, a charge pump circuit, a capacitive (e.g., loop filter) circuit, a voltage controlled oscillator (VCO), and a feedback circuit that function in a manner similar to that of conventional PLL circuits to generate a PLL output signal such that an output phase of the PLL output signal matches the input phase of an applied input signal. In particular, the phase frequency detector generates one or more pump control voltages in response to a phase difference between the output phase and the input phase, and the charge pump circuit is configured (e.g., using pull-up and pull-down switches) to generate a pump output current on a pump output terminal in response to the pump control voltage(s), where the pump output current either includes an intrinsic positive current component having a first intrinsic magnitude or an intrinsic negative current component having a second intrinsic magnitude, depending on the asserted/de-asserted state of the applied pump control voltage(s). According to an aspect of the generalized embodiment, the PLL circuit also includes a charge pump control circuit having an UP/DOWN difference measurement circuit that is configured to determine a magnitude difference between the first and second intrinsic magnitudes, and also includes a bias generator that is configured to generate a bias control signal having a voltage level corresponding to said determined magnitude difference. According to another aspect of the generalized embodiment, the charge pump circuit is modified (e.g., by way of one or more bias current transistors) to generate a bias current in response to the bias control signal generated by the bias generator such that the bias current is combined with one of the intrinsic positive/negative current components to generate a combined current component having a combined magnitude that is equal to the intrinsic magnitude of other (non-modified) intrinsic positive/negative current component. By measuring the magnitude difference and adjusting the charge pump operating state in this manner, PLL circuits produced in accordance with the present invention do not require a compensating time skew between the input clock and the feedback clock, thus reducing static phase error associated with conventional charge pump adjustment techniques.

According to a preferred embodiment of the present invention, the bias current amount required to achieve equalization of the positive/negative current component magnitudes is calculated and stored as a digital converter code value, and the charge pump control circuit includes a bias voltage generator (e.g., a digital-to-analog converter) configured to generate a precise bias control voltage that is utilized to control a current bias transistor provided in the charge pump such that the positive/negative current component magnitudes are matched (equal). For example, when the intrinsic (unmodified) positive current component is lower than the intrinsic (unmodified) negative current component, the corresponding magnitude difference is measured (e.g., using one of the methods mentioned below), and then the measured amount is stored as a digital converter code value. The stored digital adjustment code is then used to control a current bias transistor (e.g., a (second) pull-up switch) provided in the charge pump such that a bias current passed through the current bias transistor is combined with (supplements) the intrinsic positive current component such that the combined positive current component is generated at a magnitude (e.g., 3.5 µA) that it equals the magnitude (e.g., 3.5 µA) of the negative current component. By controlling the adjusted operating state of the charge pump using a digital adjustment code, PLL circuits produced in accordance with the present invention may be particularly useful in systems utilizing two clocks that require a high degree of alignment accuracy.

According to an embodiment, determining the magnitude difference between intrinsic (unadjusted) positive (UP) and negative (DOWN) current components generated by the PLL's charge pump involves generating a time-varying calibration control voltage by way of simultaneously applying both the intrinsic positive current component and the intrinsic negative current component to the charge pump's output terminal, then incrementally modifying (i.e., increasing or decreasing) the magnitude of one of the two current components using one or more time-varying bias currents while maintaining the other current component at its intrinsic (i.e., unmodified) magnitude level, and measuring the incremental changes of a calibration control voltage generated by the resulting calibration pump output current on a capacitive (e.g., loop filter) circuit. This calibration operation can be visualized using current and voltage charts in which an inflection point occurs in the time-varying calibration control voltage values when the combined/modified current component magnitude, which is generated by summing the incrementally increasing bias current and the intrinsic current component magnitude, matches the other current component's intrinsic magnitude level. The current adjustment amount, which is the value of the bias current corresponding to the detected inflection point, is then stored as the digital adjustment code, and is subsequently used to control the charge pump such that the current adjustment amount is added to the intrinsic current component magnitude such that the charge pump generates matching UP/DOWN current components during subsequent normal PLL operations. This calibration method provides a reliable mechanism for accurately determining current magnitude mismatches between the UP/DOWN current components generated by the charge pump circuit, thus facilitating low cost and reliable PLL circuits that achieve substantially improved phase-locked loop performance over conventional PLL circuits.

According to alternative practical embodiments, PLL circuits are configured to perform the above-mentioned calibration process during a power-up/reset period that occurs before normal PLL operations, during normal operations (i.e., runtime calibration), or both. In the pre-operation calibration case, the intrinsic current component generated by the PLL's primary charge pump are utilized during the calibration period (i.e., such that the primary charge pump simultaneously outputs the intrinsic positive current component, the intrinsic negative current component, and the time-varying bias current to a capacitive circuit), and the difference measurement circuit is coupled to the pump output terminal to measure the resulting calibration controlled voltage and to generate a corresponding digital converter code value. In the runtime calibration case, the charge pump control circuit includes separate (second) calibration charge pump and separate (second) calibration capacitive circuit that are essentially identical to the primary charge pump and primary capacitive circuit (loop filter), and periodically performs the above-mentioned calibration process in parallel with normal PLL operating processes. In this case, the digital converter code, which is periodically refreshed to account for changes in the calibration controlled voltage generated by the calibration charge pump, is utilized to continuously refine operations of the primary charge pump to account for changes between the intrinsic positive/negative current components due, for example, to ambient temperature changes or circuit aging.

According to alternative specific embodiments, the inflection point, which is used to identify the magnitude difference between the intrinsic positive and negative current components forming the PLL's charge pump output current, is determined using various techniques. In one embodiment, an envelope detector configured to generate an envelope signal based on the calibration controlled voltage, and a comparator configured to indicate when the envelope signal deviates from the calibration controlled voltage, which is used to identify the inflection point. An optional amplifier may be utilized to amplify the calibration controlled voltage applied to one input terminal of the comparator. In another embodiment, a phase lock circuit generates a frequency lock signal that indicates when the PLL output phase matches the PLL input phase, and this frequency lock signal is utilized to initiate a count sequence that increments one value for each change in the bias current generated during the calibration phase. In this case, the comparator is configured to terminate the count sequence when the controlled voltage returns to its initial value, and the final count value is divided by two to determine the inflection point. In each instance, the determined inflection point is used to reliably and accurately generate the digital converter code value.

BRIEF DESCRIPTION OF THE DRAWINGS

These and other features, aspects and advantages of the present invention will become better understood with regard to the following description, appended claims, and accompanying drawings, where:

FIGS. 2A, 2B and 2C illustrate a charge pump circuit during various operating periods according to an exemplary embodiment;

DETAILED DESCRIPTION OF THE DRAWINGS

The present invention relates to an improvement in phase locked loop circuits. The following description is presented to enable one of ordinary skill in the art to make and use the invention as provided in the context of a particular application and its requirements. As used herein, the terms "coupled" and "connected" are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
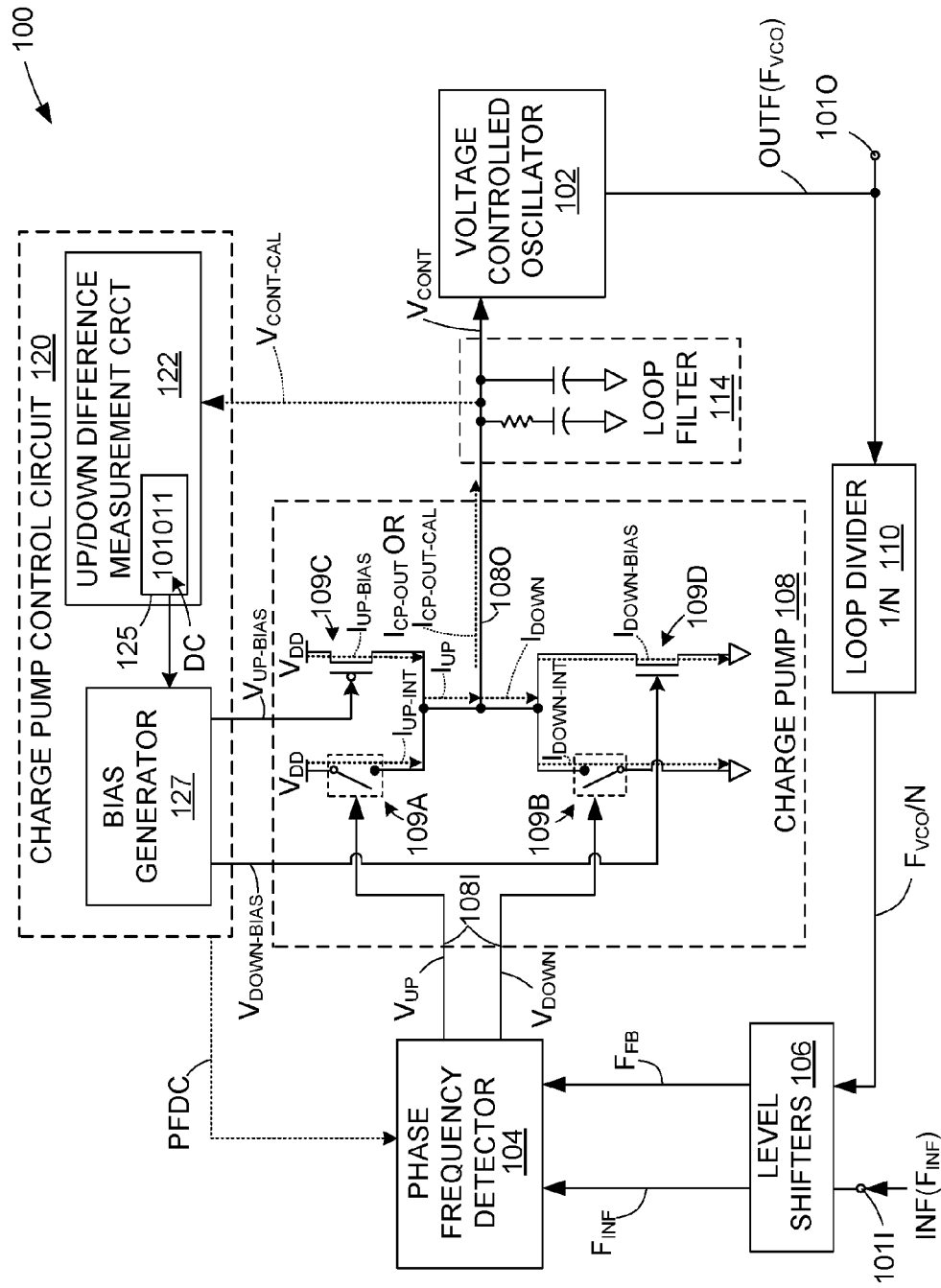
FIG. 1 illustrates an enhanced PLL circuit according to a generalized embodiment of the invention.
Figure 7A:
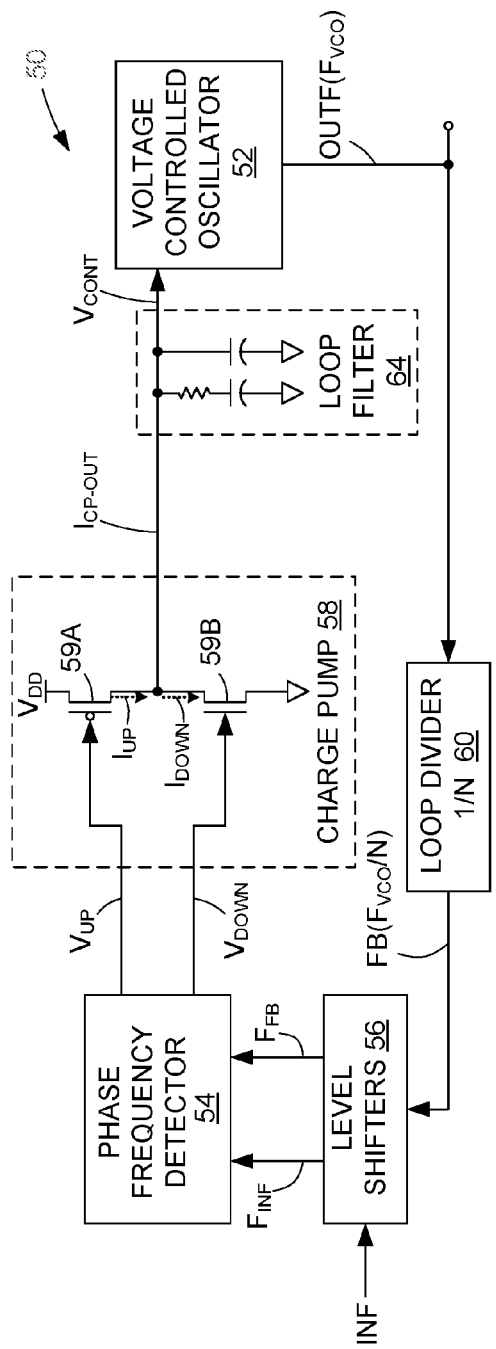
FIGS. 7A and 7B illustrate a conventional phase locked loop circuit and an exemplary timing diagram showing its operation.
Figure 7B:
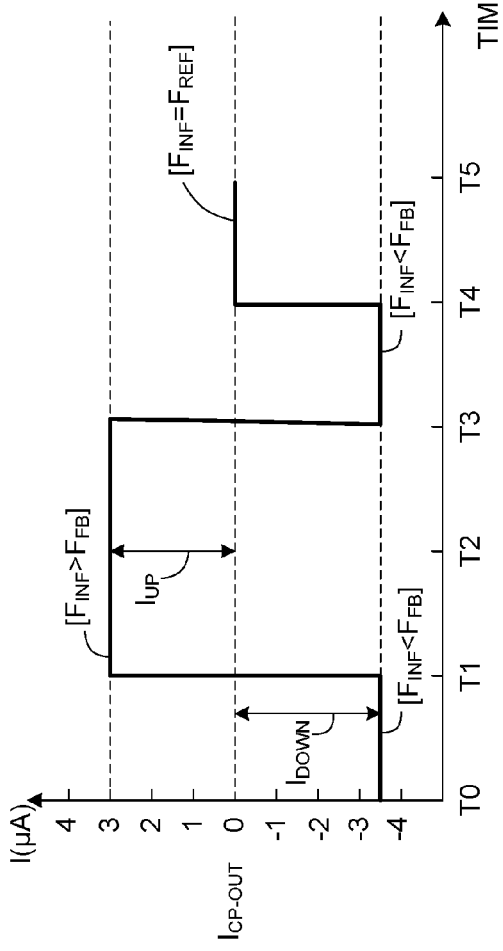

FIG. 1 shows a phase locked loop (PLL) circuit 100 according to an exemplary generalized embodiment of the invention. Similar to conventional PLL 50 (see FIG. 7A), PLL 100 is fabricated as part of a larger integrated circuit (IC) device (not shown), and utilizes a PFD 104, a charge pump 108, a capacitive circuit (e.g., a loop filter) 114, a VCO 102, a loop divider 110 and optional level shifters 106 such that PLL circuit 100 generates an output signal frequency OUTF at a PLL output terminal 101O having an output phase $F_{VCO}$ that matches the input phase $F_{INF}$ of an input signal frequency INF applied to a PLL input terminal 101I.

PFD 104 is configured using known techniques to generate at least one pump control voltage in response to a phase difference between said output phase $F_{VCO}$ and said input phase $F_{INF}$. In the exemplary embodiment, PFD 104 generates pump control voltages $V_{UP}$ and $V_{DOWN}$ such that pump control voltages $V_{UP}$ and $V_{DOWN}$ have first voltage levels (values) when the output phase $F_{VCO}$ (as indicated by a corresponding feedback phase $F_{FB}$) leads the input phase $F_{INF}$, such that pump control voltages $V_{UP}$ and $V_{DOWN}$ have second values when the output phase lags the input phase, and such that pump control voltages $V_{UP}$ and $V_{DOWN}$ have third values when the output phase matches the input phase.

Charge pump circuit 108 is configured to generate a pump output current $I_{CP\text{-}OUT}$ on a pump output terminal 108O in response to pump control voltages $V_{UP}$ and $V_{DOWN}$ such that, during normal operation, pump output current $I_{CP\text{-}OUT}$ consists either of a positive (UP) current component $I_{UP}$, a negative (DOWN) current component $I_{DOWN}$, or has no current level. The positive (UP) current component $I_{UP}$ is at least partially controlled by a (first) pull-up switch 109A that is either fully turned on or fully turned off by pump control voltage $V_{UP}$, thereby selectively coupling pump output node 108O to a high voltage supply $V_{DD}$. That is, when pump control voltage $V_{UP}$ has a first state (e.g., high), charge pump output current $I_{CP\text{-}OUT}$ includes an intrinsic positive (UP) current component $I_{UP\text{-}INT}$ having a first intrinsic magnitude determined by the characteristics (e.g., size) of pull-up switch 109A. Similarly, the negative (DOWN) current component $I_{DOWN}$ is at least partially controlled by a (first) pull-down switch 109B that is either fully turned on or fully turned off by pump control voltage $V_{DOWN}$, thereby selectively coupling pump output node 108O to a low voltage supply (ground) such that, when pump control voltage $V_{DOWN}$ has a first state (e.g., high), charge pump output current $I_{CP\text{-}OUT}$ includes an intrinsic negative (DOWN) current component $I_{DOWN\text{-}INT}$ having a (second) intrinsic magnitude determined by the characteristics of pull-down switch 109A. During normal operation, when pump control voltages $V_{UP}$ and $V_{DOWN}$ have the first (leading) values, pull-up switch 109A is turned on and pull-down switch 109B is turned off, whereby charge pump 108 is controlled to generate output current $I_{CP\text{-}OUT}$ at a positive (charge increasing) current value corresponding at least to intrinsic positive (UP) current component $I_{UP\text{-}INT}$ passed through pull-up switch 109A. Conversely, when pump control voltages $V_{UP}$ and $V_{DOWN}$ have the second (lagging) values, pull-down switch 109B is turned on and pull-up switch 109A is turned off, whereby charge pump 108 is controlled to generate output current $I_{CP\text{-}OUT}$ at a negative (charge decreasing) current value corresponding at least to intrinsic negative (DOWN) current component $I_{DOWN\text{-}INT}$ passed through pull-down switch 109B. Finally, when both pump control voltages $V_{UP}$ and $V_{DOWN}$ have the third (e.g., low) values, both pull-up switch 109A and pull-down switch 109B are turned off, whereby charge pump 108 is controlled to generate pump output current $I_{CP\text{-}OUT}$ at a neutral (zero) current level.

Charge pump 108 is further configured such that at least one of positive (UP) current component $I_{UP}$ and negative (DOWN) current component $I_{DOWN}$ includes both the associated intrinsic current component mentioned above, and also a bias current component that serves to adjust the associated intrinsic current component in order to equalize current components $I_{UP}$ and $I_{DOWN}$. As depicted in FIG. 1, positive current component $I_{UP}$ is generated by combining both associated intrinsic positive current component $I_{UP\text{-}INT}$ and an optional positive bias current component $I_{UP\text{-}BIAS}$ that is passed through a (second) pull-up transistor 109C, which is controlled in the manner described below. Similarly, negative current component $I_{DOWN}$ is generated by combining both associated intrinsic negative current component $I_{DOWN\text{-}INT}$ and an optional negative bias current component $I_{DOWN\text{-}BIAS}$ that is passed through a (second) pull-down transistor 109D, which is controlled in the manner described below. In a presently preferred embodiment only one of current components $I_{UP}$ and $I_{DOWN}$ are modified by way of a corresponding bias current $I_{UP\text{-}BIAS}$ or $I_{DOWN\text{-}BIAS}$ and the other current component $I_{UP}$ and $I_{DOWN}$ includes only its corresponding intrinsic current component $I_{UP\text{-}INT}$ or $I_{DOWN\text{-}INT}$. For example, in the specific embodiments described below, positive current component $I_{UP}$ includes both intrinsic positive current component $I_{UP\text{-}INT}$ and positive bias current $I_{UP\text{-}BIAS}$, and negative current component $I_{DOWN}$ is made up entirely of negative intrinsic current component $I_{DOWN\text{-}INT}$ (i.e., negative bias current $I_{DOWN\text{-}BIAS}$ is zero). Those skilled in the art will recognize that this arrangement may be reversed (i.e., such that negative current component $I_{DOWN}$ comprises both intrinsic and bias current components, and positive current component $I_{UP}$ includes only intrinsic positive current component $I_{UP\text{-}INT}$ that the bias current may be utilized to reduce, instead of increase, the combined current components $I_{UP}$ and $I_{DOWN}$ (e.g., by way of connecting one or more of transistors 109C and 109D in series with switches 109A and 109B, respectively, and controlling transistors 109C and 109D to reduce the current passed through switches 109A and 109B). Accordingly, providing charge pump 108 with at least one of pull-up transistor 109C and pull-down transistor 109D facilitates adjusting the associated intrinsic current component in order to equalize current components $I_{UP}$ and $I_{DOWN}$ using the methods described below.

Capacitive circuit (loop filter) 114 is connected to pump output terminal 108O, and is configured using known techniques to generate a charge (controlled voltage) $V_{CONT}$ at a level that is controlled by the time-varying composition of pump output current $I_{CP\text{-}OUT}$. That is, controlled voltage $V_{CONT}$ is caused to increase to a higher voltage level when charge pump 108 is controlled by PFD 104 to generate pump output current $I_{CP\text{-}OUT}$ at positive current component $I_{UP}$, and controlled voltage $V_{CONT}$ is caused to decrease to a lower voltage level when charge pump 108 is controlled by PFD 104 to generate pump output current $I_{CP\text{-}OUT}$ at negative current component $I_{DOWN}$. Controlled voltage $V_{CONT}$ is therefore generated at a desired voltage level by way of controlling the amount of time pump output current $I_{CP\text{-}OUT}$ is at positive current component $I_{UP}$ versus the amount of time pump output current $I_{CP\text{-}OUT}$ is at negative current component $I_{DOWN}$.

VCO 102 has an input terminal connected to loop filter 114, and is configured according to known techniques to generate output signal frequency OUTF on PLL output circuit 101O such that its instantaneous output phase $F_{VCO}$ is adjusted in accordance with instantaneous corresponding value of controlled voltage $V_{CONT}$.

Loop divider 110 and optional level shifters 106 are connected in series between PLL output terminal 101O and PFD 104, and are configured using known techniques to function as a feedback circuit that generates feedback signal frequency $F_{FB}$ supplied to PFD 104 substantially as described above with reference to corresponding circuit elements utilized by conventional PLL 50.

PLL circuit 100 also includes a charge pump control circuit 120 that is configured to determine a magnitude difference between intrinsic current components $I_{UP\text{-}INT}$ and $I_{DOWN\text{-}INT}$, and to generate at least one bias control Signal $V_{UP\text{-}BIAS}$ and/or $V_{DOWN\text{-}BIAS}$ that controls charge pump 108 during subsequent normal PLL operations to generate positive current component $I_{UP}$ and negative current component $I_{DOWN}$ at equal magnitude levels. In the exemplary generalized embodiment, charge pump control circuit 120 includes an UP/DOWN (pump output current) measurement circuit 122 that determines the magnitude difference between intrinsic current components $I_{UP\text{-}INT}$ and $I_{DOWN\text{-}INT}$ by way of measuring a calibration controlled voltage $V_{CONT\text{-}CAL}$ generated on capacitive circuit 114 in response to pump output current $I_{CP\text{-}OUT}$ from the PLL's primary charge pump (i.e., charge pump 108) during a calibration period performed during power-up or reset of the IC (not shown) implementing PLL circuit 100. In an alternative embodiment described below with reference to FIG. 6, the calibration controlled voltage $V_{CONT-CAL}$ utilized by measurement circuit 122 is generated by a duplicate (secondary) calibration charge pump and calibration capacitive circuits. In either case, measurement circuit 122 implements one of the measurement methods described below (e.g., with reference to FIG. 2) to determine the magnitude difference between intrinsic current components $I_{UP-INT}$ and $I_{DOWN-INT}$ then generates a digital adjustment code DC having a digital/binary value (e.g., "101011") that corresponds to the measured difference, and then stores digital adjustment code DC in a memory circuit 125. In addition, charge pump control circuit 120 includes a bias voltage generator 127 (e.g., a digital-to-analog converter) that is configured to generate corresponding bias control signals $V_{UP-BIAS}$ and/or $V_{DOWN-BIAS}$ having corresponding voltage levels that vary directly with the digital value of digital adjustment signal DC), where bias voltage generator 127 is operably coupled to transmit bias control signals $V_{UP-BIAS}$ and/or $V_{DOWN-BIAS}$ to transistors 109C and 109D, respectively, of charge pump circuit 108 during subsequent normal PLL operation periods. In one embodiment charge pump control circuit generates an optional phase frequency detector control signal PFDC that is utilized to control PFD 104 such that both intrinsic current components $I_{UP-INT}$ and $I_{DOWN-INT}$ are applied to pump output terminal 108O during the calibration operating period. With this configuration, charge pump control circuit 120 causes charge pump circuit 108 to generate at least one of bias currents $I_{UP-BIAS}$ and/or $I_{DOWN-BIAS}$ in response to bias control signals $V_{UP-BIAS}$ and/or $V_{DOWN-BIAS}$ such that a corresponding bias current $I_{UP-BIAS}$ or $I_{DOWN-BIAS}$ is combined with one of intrinsic positive current components $I_{UP-INT}$ or $I_{DOWN-INT}$ to generate a combined current component $I_{UP}$ or $I_{DOWN}$ such that a combined magnitude of the combined current component (e.g., $I_{UP}$) is equal to the magnitude of the other intrinsic current component (i.e., intrinsic negative current component $I_{DOWN-INT}$), whereby current components $I_{UP}$ and $I_{DOWN}$ are generated at substantially equal magnitude levels during normal PLL operations.

According to an aspect of the present invention, the measured difference between intrinsic UP (positive) current component $I_{UP-INT}$ and intrinsic DOWN (negative) current component $I_{DOWN-INT}$ is determined during a calibration operation period, for example, by way of controlling charge pump 108 to generate a time-varying calibration current $I_{CP-OUT-CAL}$ by simultaneously supplying intrinsic UP (positive) current component $I_{UP-INT}$, intrinsic DOWN (negative) current component $I_{DOWN-INT}$ and an incrementally changing (e.g., gradually increasing) bias current (e.g., $I_{UP-BIAS}$ or $I_{DOWN-BIAS}$) to pump output terminal 108O of charge pump 108, and monitoring changes in a calibration controlled voltage $V_{CONT-CAL}$ that is generated on loop filter 114 in response to time-varying calibration current $I_{CP-OUT-CAL}$ in order to detect when, e.g., a combined UP current component $I_{UP}$ formed by combining intrinsic UP (positive) current component $I_{UP-INT}$ and bias current $I_{UP-BIAS}$ matches intrinsic DOWN current component $I_{DOWN-INT}$. As described below with reference to FIG. 2, an inflection point detection approach provides a simple and reliable method for determining the precise point at which the magnitudes of the adjusted UP current component matches the DOWN current component, e.g., by way of identifying when the measured controlled voltage $V_{CONT}$ stops decreasing and then begins to increase (i.e., at a corresponding inflection point). By correlating the detected inflection point with the amount of additional current applied to the UP current component at that point in time, the amount of additional current added to the UP current component (i.e., the amount by which the UP current component was adjusted to achieve an equal magnitude with the DOWN current component) can be accurately identified. Operation of charge pump 108 can then be adjusted, e.g., by generating digital adjustment code DC with a value corresponding to the measured additional current amount, and storing digital adjustment code DC in a memory circuit 125 such that the stored value is operably transferred to bias generator 127 such that a corresponding updated control signal $V_{UP-BIAS}$ is provided to the charge pump 108, whereby the on-state of pull-up PMOS transistor 109C is adjusted (increased) to provide the additional bias current amount $I_{UP-BIAS}$. As indicated in FIG. 1, bias current amount $I_{UP-BIAS}$ which is added to (combined with) intrinsic UP current component $I_{UP-INT}$, thereby providing a combined (adjusted) positive current component $I_{UP}$ to the pump's output terminal that has the same magnitude as negative current component $I_{DOWN}$ during subsequent normal PLL operations (i.e., in this case bias current component $I_{DOWN-BIAS}$ is zero). In an alternative embodiment, a negative bias current component $I_{DOWN-BIAS}$ may be calculated using the method described above such that combined (adjusted) negative current component $I_{DOWN}$ has the same magnitude as intrinsic positive current component $I_{UP-INT}$ during subsequent normal PLL operations (i.e., in this case bias current component $I_{UP-BIAS}$ is zero). As set forth in the alternative specific embodiments set forth below, various circuits and methods may be used to detect the inflection point, calculate the required current adjustment amount, and generate the digital adjustment code.

Figure 2:
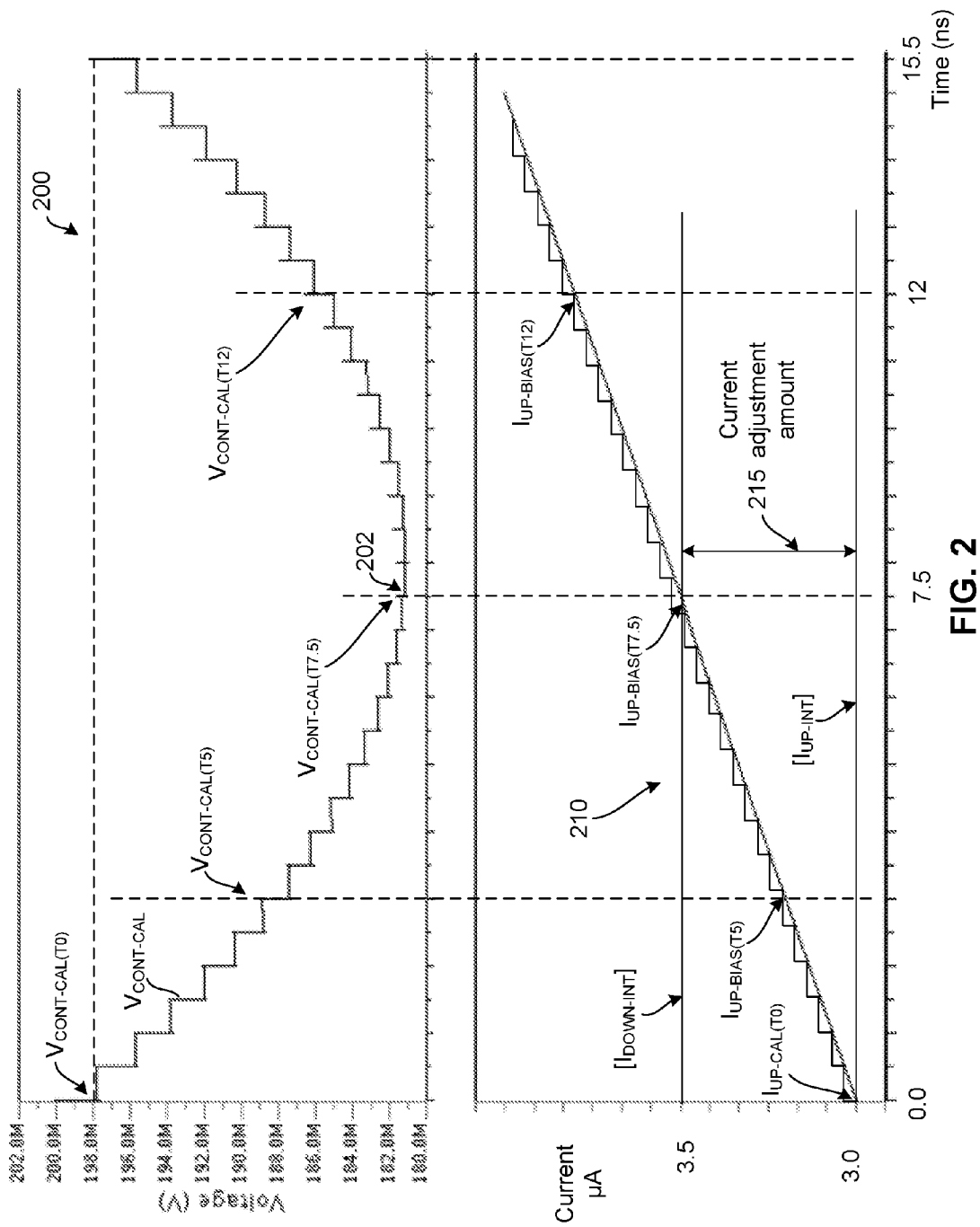
FIG. 2 illustrates a time-voltage curve generated in accordance with an exemplary embodiment.

FIG. 2 includes exemplary charge and current graphs illustrating a calibration process utilizing the inflection point approach (mentioned above), and FIG. 2A illustrates a modified charge pump 108A during the calibration process. For brevity, modified charge pump 108A includes only one bias current transistor (i.e., pull-up transistor 109C) utilized to generate an increasing time-varying bias current amount $I_{UP-BIAS-TX}$ that is combined with intrinsic positive current component $I_{UP-INT}$. For explanatory purposes pull-up transistor 109C is shown as being connected in parallel with pull-up switch 109A, but it is understood that other configurations (e.g., series connection) may also be utilized. Referring to the lower portion of FIG. 2, the present example assumes that the magnitude of intrinsic UP current component $I_{UP-INT}$ (i.e., "$[I_{UP-INT}]$") is lower than the magnitude of intrinsic DOWN current component $I_{DOWN-INT}$ (i.e., "$[I_{DOWN-INT}]$"). Specifically, in the illustrated example, intrinsic UP current component $I_{UP-INT}$ has a magnitude of 3.0 µA, which is generated through pull-up switch 109A in response to assertion of pump control voltage $V_{UP}$, and intrinsic DOWN current component $I_{DOWN-INT}$ has a magnitude of 3.5 µA, which is generated through pull-down switch 109B in response to assertion of pump control voltage $V_{DOWN}$.

Referring to FIG. 2A, at the beginning of the calibration process charge pump 108A is controlled to simultaneously supply both intrinsic UP current component $I_{UP-INT}$ and intrinsic DOWN current component $I_{DOWN-INT}$ to a capacitive circuit (not shown) by way of asserting both pump control voltage $V_{UP}$ and $V_{DOWN}$, thereby generating a calibration controlled voltage $V_{CONT-CAL(TX)}$ on pump output terminal 108O, where the suffix "TX" indicates that calibration controlled voltage $V_{CONT-CAL}$ varies with time T. As set forth above and illustrated in FIG. 2, the calibration controlled voltage $V_{CONT-CAL(T0)}$ generated by combining intrinsic current components $I_{UP-INT}$ and $I_{DOWN-INT}$ at the beginning of the calibration process (i.e., when bias current $I_{UP-BIAS(TX)}$ is zero) has a relatively high initial voltage level (e.g., approximately 200 millivolts) due to the larger magnitude of negative current component $I_{DOWN-INT}$. In one embodiment, the calibration process is initiated after a phase lock signal is generated indicating that phases of the PLL input and output signals are matched, whereby the initial value of $V_{CONT-CAL(T0)}$ is at a balance point.

Referring to the lower portion of FIG. 2, bias current $I_{UP-BIAS-TX}$ is gradually increased by a small amount each half nanosecond (i.e., by gradually changing bias voltage $V_{UP-BIAS-TX}$ such that bias current $I_{UP-BIAS-TX}$ passed through pull-up transistor 109C increases incrementally as indicated). As indicated in FIG. 2A, combined calibration UP current $I_{UP-CAL}$ is formed by time-varying bias current $I_{UP-BIAS-TX}$ combined with (added to) positive intrinsic current component $I_{UP-INT}$, and therefore gradually increases during the calibration process. In contrast, the only DOWN current generated by charge pump circuit 108A is intrinsic negative current component $I_{DOWN-INT}$ which remains fixed (unchanged) during the calibration process. Referring to the upper portion of FIG. 2, because the magnitude of intrinsic current component $I_{UP-INT}$ is initially significantly lower than the magnitude of intrinsic DOWN current magnitude (i.e., at time T0), and because the magnitude difference between the intrinsic current components is maximum at time T0, calibration controlled voltage $V_{CONT-INT}$ is initially pulled lower by a relatively large amount, as indicated by the downward sloping portion of voltage curve 200 shown in the upper-left portion of FIG. 2. As calibration UP current $I_{UP-CAL}$ is incrementally increased over time (i.e., as indicated in the lower portion of FIG. 2), the difference between the magnitudes of calibration UP current $I_{UP-CAL}$ and intrinsic DOWN current component $I_{DOWN-INT}$ decreases, but while the magnitude of intrinsic DOWN current component remains larger than calibration UP current $I_{UP-CAL}$, the value of calibration controlled voltage $V_{CONT-CAL}$ continues to decrease. Eventually, as indicated at time 7.5 in FIG. 2, when bias current $I_{UP-BIAS-T7.5}$ has increased to 0.5 μA, calibration UP current $I_{UP-CAL}$ becomes equal to intrinsic DOWN current component $I_{DOWN-INT}$, whereby $V_{CONT-CAL}$ stops decreasing (i.e., at inflection point 202). Subsequently, as the UP current component continues to incrementally increase above the magnitude of the DOWN current component due to the continued incremental increase of bias current $I_{UP-BIAS-TX}$, calibration controlled voltage $V_{CONT-CAL}$ begins to increase, as indicated by the upward sloping portion of the curve shown in the upper-right portion of FIG. 2. Calibration controlled voltage $V_{CONT-CAL}$ thus evolves according to the example time-voltage curve 200.

In exemplary embodiments provided herein, the improved phase locked loop circuits of the present invention adjust one of the UP or DOWN current components by way of performing the calibration process described above and detecting inflection point 202 in the resulting time-voltage curve 200, utilizing the inflection point data to determine the total current adjustment amount (e.g., amount 215 shown in the lower portion of FIG. 2) by which the magnitude of the UP current component was increased in order to match the magnitude of the negative DOWN current component, and then adjusting one or both of the UP or DOWN current components generated by charge pump 108A during subsequent normal operation. That is, FIG. 2B depicts the operating state of charge pump circuit 108A during subsequent normal operation time period NO1 when pump control voltages $V_{UP}$ and $V_{DOWN}$ have the first (leading) values, whereby pull-up switch 109A is turned on and pull-down switch 109B is turned off. In this case, charge pump output current $I_{CP-OUT}$ is equal to the UP current $I_{UP}$, which is a combination of that intrinsic UP current component $I_{UP-INT}$ and by bias current $I_{UP-BIAS-DC}$, where bias current $I_{UP-BIAS-DC}$ is equal to determined current adjustment amount 215 (see FIG. 2), and is generated by way of turning on pull-up transistor 109C using pump bias voltage $V_{UP-BIAS-DC}$ whose voltage level is determined by a stored digital adjustment code corresponding to the determined current adjustment amount 215. In contrast, FIG. 2C depicts the operating state of charge pump circuit 108A during normal operation time period NO2 when pump control voltages $V_{UP}$ and $V_{DOWN}$ have the second (lagging) values, whereby pull-up switch 109A is turned off and pull-down switch 109B is turned on. In this case, charge pump output current $I_{CP-OUT}$ is equal to the intrinsic DOWN current component $I_{DOWN-INT}$. There are generally two techniques by which the inflection point 202 may be determined, as described in conjunction with FIG. 4 and FIG. 5.

Figure 3:
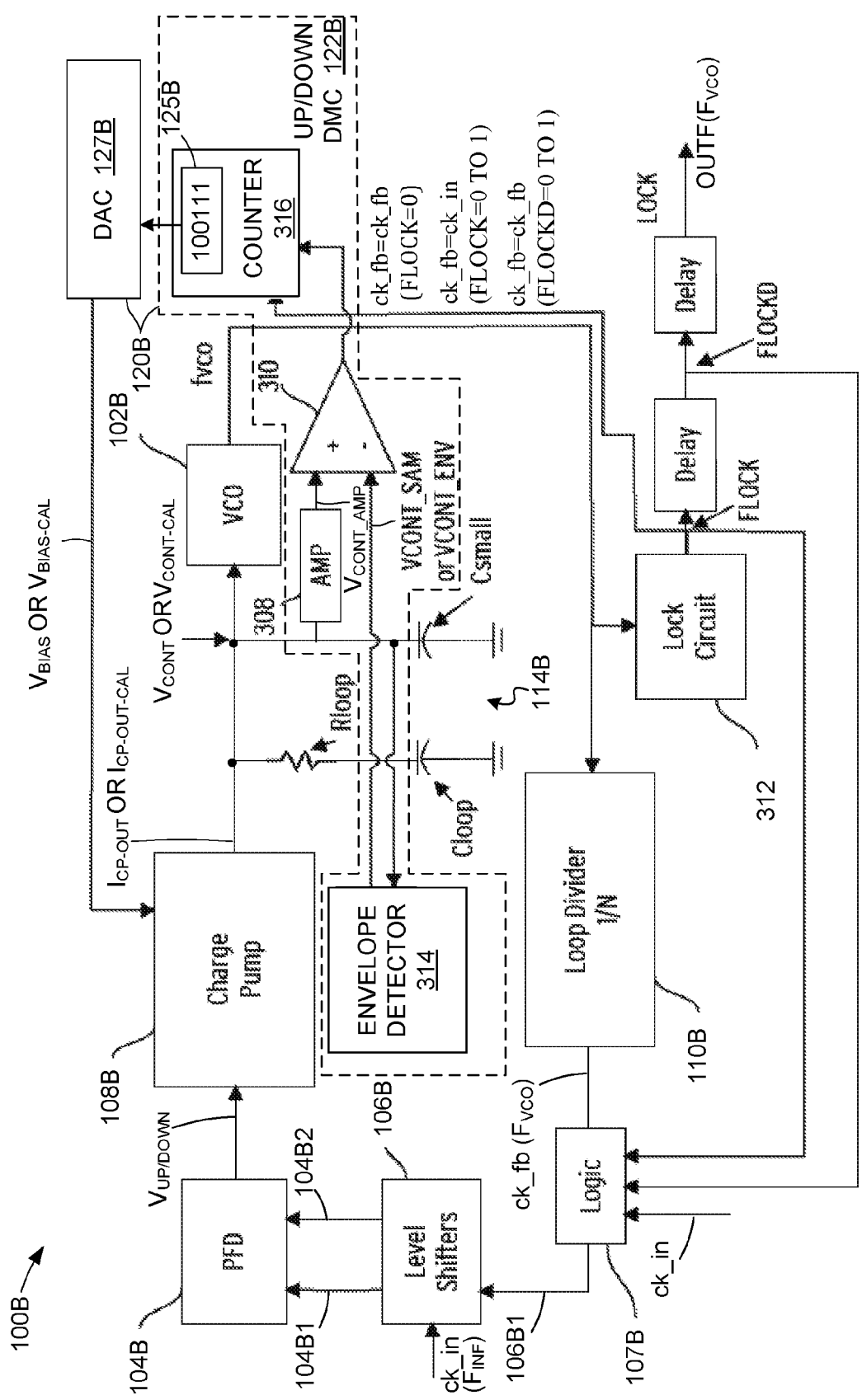
FIG. 3 illustrates a PLL loop circuit according to an exemplary embodiment.

FIG. 3 illustrates an enhanced PLL circuit 100B according to an exemplary practical embodiment of the invention that performs the above-mentioned calibration process during a power-up/reset period (i.e., before normal PLL operations). Portions of PLL circuit 100B that perform similar functions to those performed by portions of PLL circuit 100 (described above) are identified with similar reference numbers, and are understood to function substantially as described above unless stated otherwise below.

Phase frequency detector (PDF) 104B is configured to generate at least one pump control voltage $V_{UP/DOWN}$ in response to a phase difference between a feedback (output) clock signal ck_fb and an input clock signal ck_in during normal PLL operations.

Charge pump circuit 108B is configured using the techniques described above to generate an output current according to the PLL operating mode. During normal PLL operations, charge pump circuit 108B generates pump output current $I_{CP-OUT}$ including either an UP (positive) current component or a DOWN (negative) current component in response to pump control voltage $V_{UP/DOWN}$, where the UP (positive) current component is adjusted by way of an applied fixed bias signal $V_{BIAS}$ in the manner described above. During calibration operations charge pump circuit 108B generates pump output current $I_{CP-OUT-CAL}$ including both intrinsic UP (positive) and DOWN (negative) current components along with a time-varying bias current component generated in accordance with a time-varying bias signal $V_{BIAS-CAL}$ in the manner described above with reference to FIG. 2.

Capacitive circuit 114A is coupled to the output terminal of charge pump 108B and includes a loop resistor Rloop, a loop capacitor Cloop and a small capacitor Csmall that are configured to generate controlled voltages $V_{CONT}$ or $V_{CONT-CAL}$ in response to pump output currents $I_{CP-OUT}$ or $I_{CP-OUT-CAL}$, respectively.

Charge pump control circuit 120B includes an UP/DOWN difference measurement circuit (UP/DOWN DMC) 122B configured to determine a magnitude difference between intrinsic UP (positive) and DOWN (negative) current components of pump output current $I_{CP-OUT-CAL}$ generated by charge pump 108B during calibration operations, and to store a digital adjustment code value DC (e.g., binary "100111") in a memory circuit 125B. In one embodiment, measurement circuit 122B includes an envelope detector 314 coupled to capacitive circuit 114B and configured to generate an envelope signal $V_{CONT-ENV}$ based on calibration controlled voltage $V_{CONT-CAL}$, and a comparator 310 configured to compare envelope signal $V_{CONT-ENV}$ with calibration controlled voltage $V_{CONT-CAL}$. In cases where the Csmall capacitor is relatively large, every step increase in the bias current may produce such a small step increase in calibration controlled voltage $V_{CONT-CAL}$ that these step increases can be overlooked by comparator 310 due to it's own input offset voltage. In such cases, an optional amplifier 308 is connected between capacitive circuit 114B and comparator 310 to supply amplified controlled voltage $V_{CONT-AMP}$ to comparator 310 so that comparator 310 reliably triggers, thereby facilitating reliable detection of an inflection point using amplified controlled voltage $V_{CONT\_AMP}$ from amplifier 308. In one embodiment, PLL circuit 100B includes a lock circuit 312 provides a frequency lock signal having a first value (FLOCK=1) when output phase $F_{VCO}$ of PLL output signal OUTF matches input phase $F_{INF}$ of applied input signal ck_in, and difference measurement circuit 122B further comprises a counter circuit 316 that is configured to generate a count value that increments in accordance with changes in the current level of the time-varying bias current, where digital adjustment code value DC based the count value accrued on counter circuit 316 during a calibration operation period in the manner described below.

Charge pump control circuit 120B also includes a digital-to-analog converter (DAC) circuit (bias generator) 122B that is configured either to generate bias control signal $V_{BIAS}$ during normal PLL operations, where bias control signal $V_{BIAS}$ is generated in accordance with the stored digital adjustment code value DC, or to generate time varying bias control signal $V_{BIAS(TX)}$ during calibration operations such that bias current $I_{UP-BIAS}$ is generated by charge pump 108B in the manner described above with reference to FIG. 2.

In one embodiment, enhanced PLL circuit 100B detects an inflection point of a time-voltage curve generated in the manner described above with reference to FIG. 2 by continuously scanning (e.g., from a lowest to a highest value) the UP (positive) current component generated by charge pump 108B. When circuit effects causing mismatch in the charge pump 108B have cancelled one other at a particular value of the UP current component, the enhanced phase locked loop circuit 100B reaches an inflection point (e.g., inflection point 202 in FIG. 2). The value of the UP current component corresponding to the inflection point is stored in the form of digital code DC that is then utilized to adjust the operation of charge pump 108B in order to minimize mismatches between the positive/negative current components generated in the charge pump 108B. The extent to which the positive/negative current component mismatch may be reduced is dependent upon the resolution of the digital to analog converter 127B. For example, to achieve an approximately 1% mismatch level (e.g., 0.8-1.2%) in the charge pump 108B, a 6-bit resolution digital to analog converter 127B may be utilized. A greater reduction in the mismatch results in a lower noise floor for the enhanced phase locked loop circuit 100B, which consequently reduces the integrated jitter. Reducing the mismatch also reduces the static phase error and reference spur level of the enhanced phase locked loop circuit 100B.

In one embodiment charge pump 108B is designed with an intrinsic skew, whereby the magnitude of one of the intrinsic DOWN current component or UP current component is naturally higher than the magnitude of the other current component (e.g., referring to FIG. 1, pull-up transistor 109A and pull-down transistor 109B are intentionally fabricated such that the magnitude of intrinsic current component $I_{UP-INT}$ is greater than the magnitude of intrinsic current component $I_{DOWN-INT}$). During operation enhanced PLL circuit 100B is first allowed to establish a frequency lock. Frequency lock (state FLOCK=1) is established when the input clock and the feedback clock, which are respectively transmitted on PFD input terminals 104B1 and 104B2, are aligned to a preconfigured tolerance. Subsequent to state FLOCK=1, logic circuit 107B transmits input clock ck_in onto level shifter input terminal 106B1 such that both input terminals 104B1 and 104B2 to phase frequency detector 104B receive input clock ck_in. Counter circuit 316 begins counting up from zero, and DAC 127B incrementally increases the UP bias current by way of increasing calibration control voltage $V_{BIAS-CAL}$. Due to the intrinsic skew of charge pump 108B, the (second) magnitude of the DOWN current component is initially higher than the (first) magnitude of the UP current component, whereby the output current generated by charge pump 108B is negative during the initial operation period, and remains negative while the UP current component is increased uniformly with every cycle of the input clock so long as the magnitude of the DOWN current component is larger than the magnitude of the UP current (e.g., in the manner depicted by the decreasing slope of time-voltage curve 200 in the upper left portion of FIG. 2). However, the increasing UP current component causes the time-voltage curve 200 to flatten out, and then to begin increasing (e.g., in the manner depicted by the increasing slope of time-voltage curve 200 in the upper right portion of FIG. 2). The inflection point 202 where the time-voltage curve 200 flattens out is the balanced state at which the mismatch between the UP and DOWN current components is fully eliminated. Due to the symmetric nature of the time-voltage curve 200, the count value ("code value") will be twice the code corresponding to the maximum available reduction in mismatch between the UP and DOWN current components. The technique of connecting both inputs 104B1 and 104B2 of PFD 104B to the same clock signal (i.e., input clock ck_in) for a period of time during the calibration process has the advantage of cancelling the PFD delay mismatches in the UP and DOWN current path indirectly, and also serves to remove mismatches in the inherent UP and DOWN current components generated by charge pump 108B in the manner described above. Also it is this technique that makes the perfect alignment of ck_in and ck_fb possible that can be used in some de-skew PLLs.

As mentioned above, FIGS. 4 and 5 are flow diagrams that respectively illustrate two techniques by which the inflection point 202 (FIG. 2) may be determined.

Figure 4:
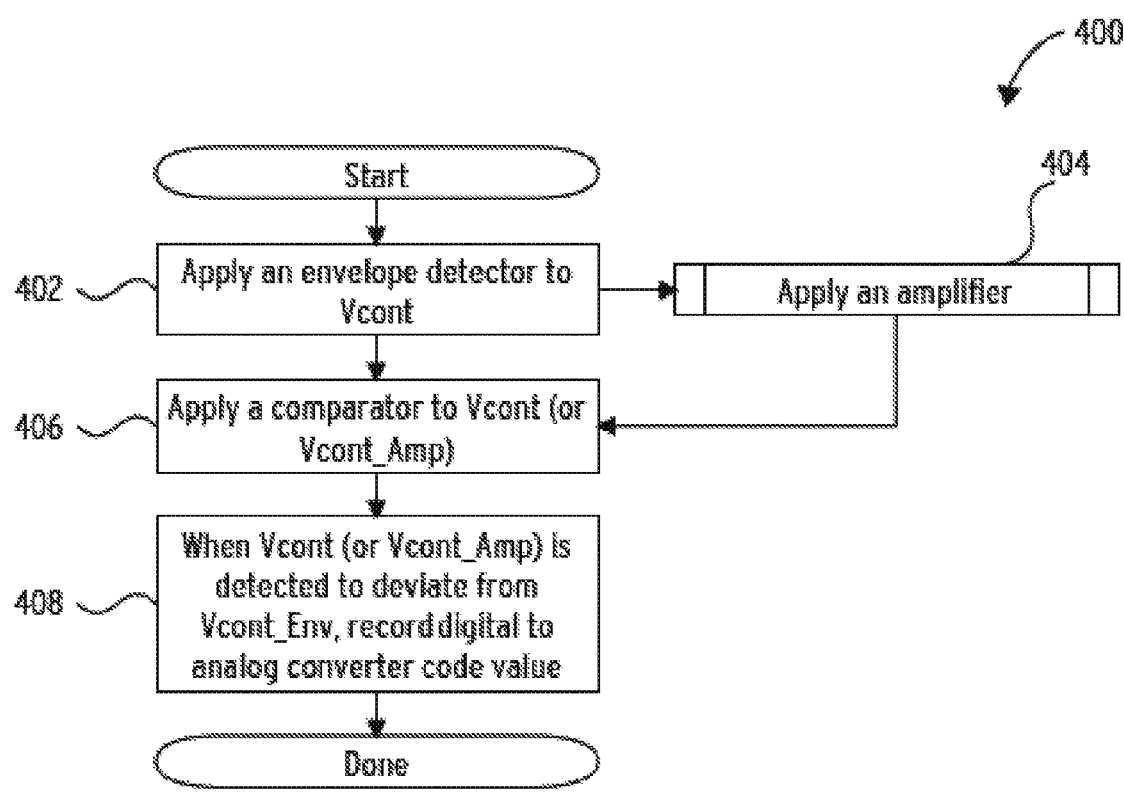
FIG. 4 illustrates a charge mismatch cancellation method according to another exemplary embodiment.

FIG. 4 illustrates a first method 400 that utilizes envelope detector 314 and comparator 310 (both shown in FIG. 3) to detect the inflection point during the calibration process. The envelope detector 314, (optionally) the amplifier 308, and the comparator 310 are coupled to controlled voltage $V_{CONT}$ (block 402, block 404, and block 406 respectively). In one embodiment the comparator 310 has an offset of 10 mV. Counter circuit 316 starts counting at the beginning of the calibration process, and increments its count value each time bias signal $V_{BIAS}$ incrementally increases the bias current applied to charge pump 108B. When $V_{CONT}$ (or $V_{CONT\_AMP}$) is detected to deviate from $V_{CONT\_ENV}$ (e.g., using comparator 310), counter 316 is stopped, and the final digital count value is stored as the digital converter code value DC, which is then passed to digital-to-analog converter (DAC) 127B (block 408). Digital converter code value DC, which is proportional to the required current offset amount needed to eliminate mismatches between the UP and DOWN current components, is then utilized to control charge pump circuit 108B in the manner described above.

Figure 5:
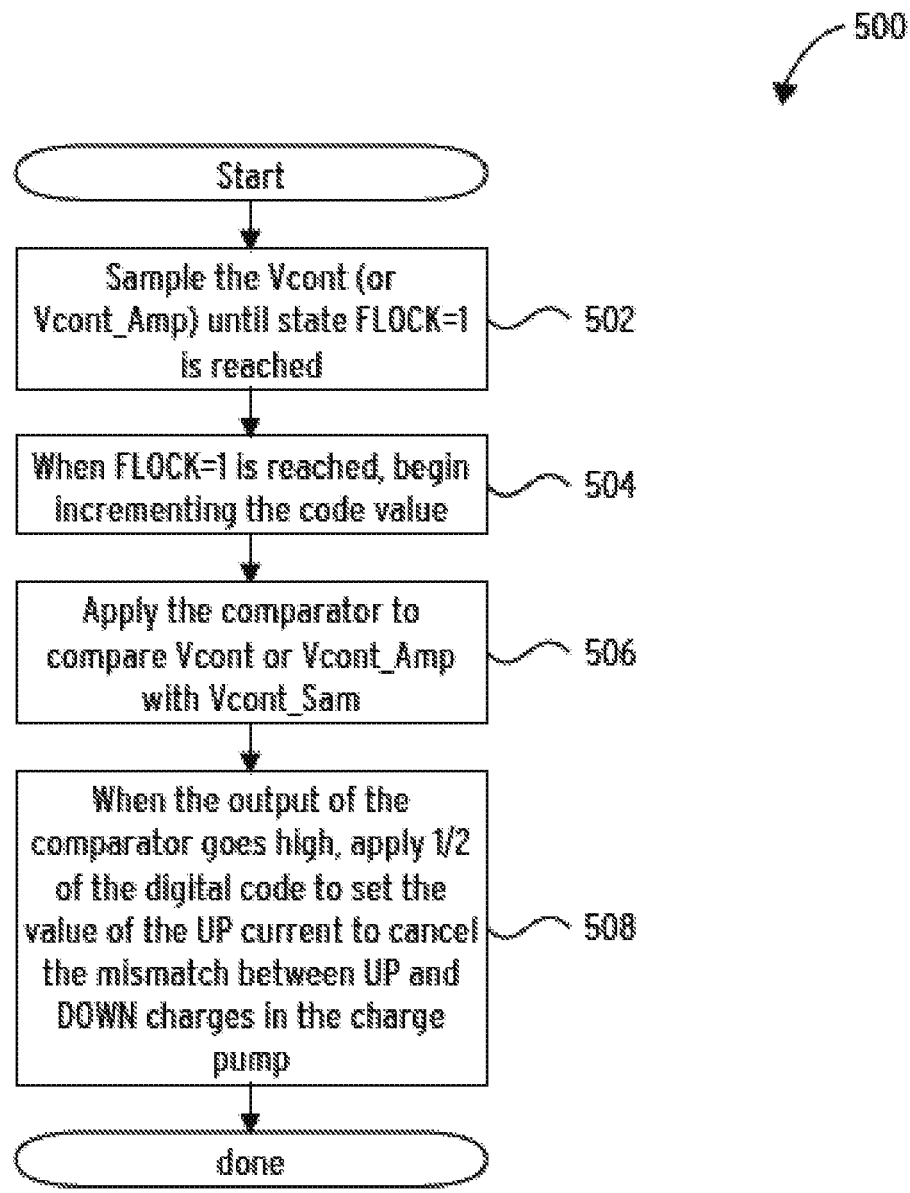
FIG. 5 illustrates a charge mismatch cancellation method according to another exemplary embodiment.

Another embodiment of a charge mismatch cancellation method 500 to operate the enhanced phase locked loop circuit 100B is illustrated in FIG. 5. In this case, lock circuit 312 (see FIG. 3) is utilized to generate a frequency lock signal having a first value (FLOCK=1) when the phase $F_{VCO}$ of PLL output signal OUTF matches the input phase $F_{INF}$ of the applied input signal. During the calibration process, $V_{CONT}$ (or $V_{CONT\_AMP}$) is sampled until locked state FLOCK=1 is reached (block 502). When FLOCK=1 is reached, incrementing of the digital code value by counter 316 begins (block 504). $V_{CONT}$ or $V_{CONT\_AMP}$ will decrease and then increase again as described above with reference to FIG. 2. Comparator 310 (e.g., with 10 mV offset) is utilized to compare $V_{CONT}$ or $V_{CONT\_AMP}$ with $V_{CONT\_SAM}$ (sample value) (block 506). When the output of the comparator 310 goes high, counter 316 is stopped, and one-half of the final digital code count is stored as the digital converter code value, which is then applied to set the value of the UP current component to cancel the mismatch between UP and DOWN current components generated by the charge pump (block 508).

Figure 6:
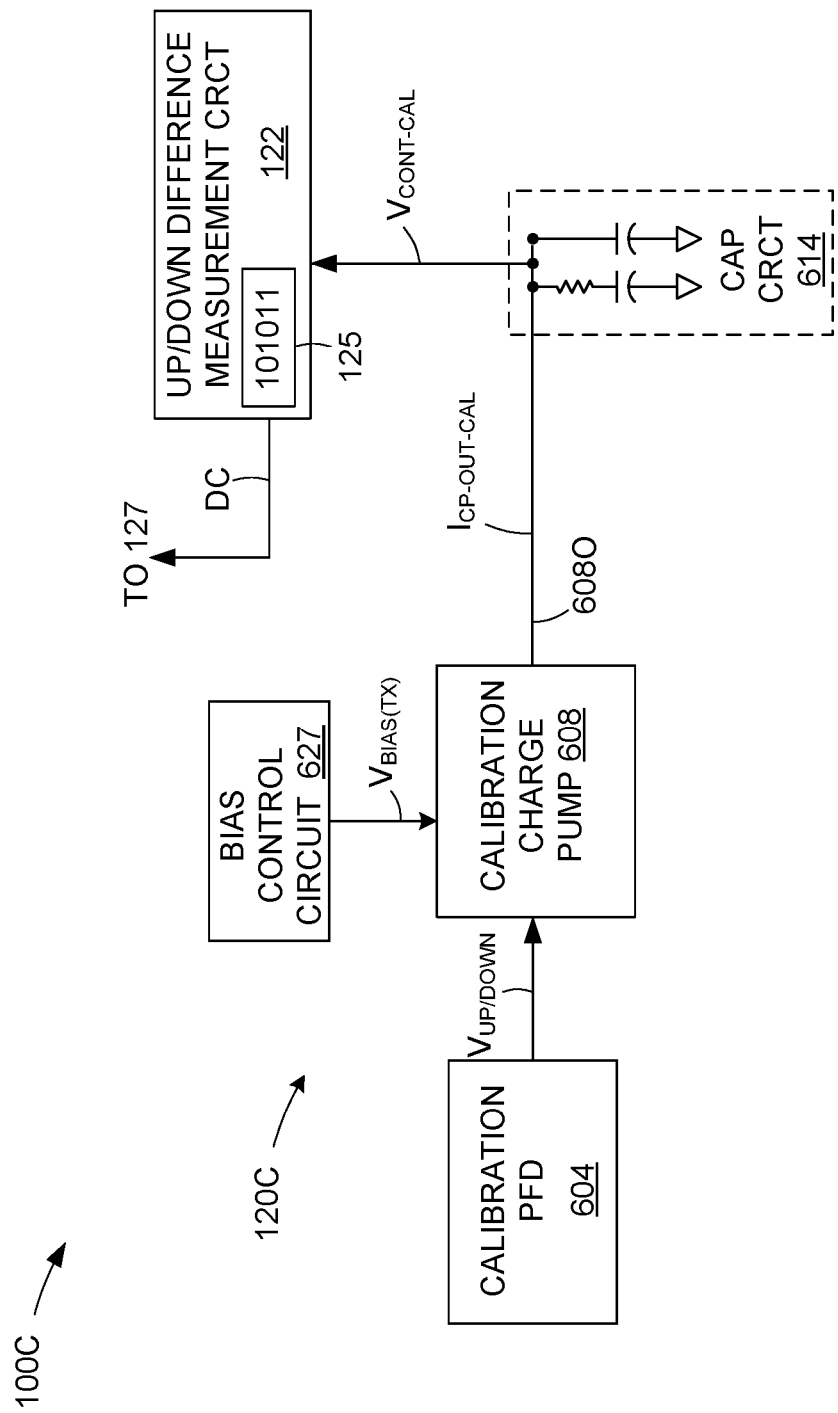
FIG. 6 illustrates an embodiment of a runtime calibration circuit according to another embodiment.

FIG. 6 shows a partial enhanced PLL circuit 100C that includes a primary charge pump and associated circuitry such as that shown in FIG. 1, and a charge pump control circuit 120C configured to achieve runtime calibration of a primary charge pump (e.g., charge pump 108 in FIG. 1) to account for variations between current components $I_{UP}$ and $I_{DOWN}$ during normal PLL operations (e.g., due to ambient temperature changes or circuit aging). To perform runtime calibration, charge pump control circuit 120C includes a (second) calibration phase frequency detector 604, a secondary calibration charge pump 608, a calibration capacitive circuit 614 and a calibration bias control circuit 627 that are configured to operate substantially identically to their corresponding primary components. That is, calibration charge pump 608 is configured to generate to generate a calibration pump output current $I_{CP-OUT-CAL}$ on a calibration pump output terminal 6080 such that calibration pump output current $I_{CP-OUT-CAL}$ includes duplicate intrinsic positive (UP) and negative (DOWN) current components that are substantially identical to those generated by the primary charge pump circuit, calibration charge pump 608 is controlled (e.g., by way of pump control signal $V_{UP/DOWN}$) to output a combination of the duplicate intrinsic positive and negative current components and a time-varying bias current (which is generated in accordance with bias control signal $V_{BIAS(TX)}$) during each calibration process. In one embodiment, the charge pump control circuit performs one of the charge pump mismatch cancellation techniques previously described (e.g., in FIG. 4 or FIG. 5). Once calibration is completed, a digital adjustment code DC corresponding to the measured magnitude difference that is generated by UP/DOWN measurement circuit 122 is then stored in memory circuit 125, and the digital adjustment code DC is then passed to bias generator 127 (described above) for control of the primary charge pump circuit (not shown) to cancel mismatches in the manner described above. The runtime calibration may be timed to repeat on a cycle at a set frequency, for example every 100 cycles of the PLL input clock. After each calibration cycle, $V_{CONT\_CAL}$ is reinitialized to $V_{CONT}$ and the digital code DC changed to cancel charge pump mismatches.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A phase locked loop (PLL) circuit configured to generate a PLL output signal such that an output phase of the PLL output signal matches the input phase of an applied input signal, the PLL circuit comprising:
   a phase frequency detector configured to generate at least one pump control voltage in response to a phase difference between said output phase and said input phase;
   a charge pump circuit configured to generate a pump output current on a pump output terminal in response to said at least one pump control voltage such that said pump output current includes an intrinsic positive current component having a first intrinsic magnitude when said at least one pump control voltage has a first pump control value, and such that said pump output current includes an intrinsic negative current component having a second intrinsic magnitude when said at least one pump control voltage has a second pump control value; and
   a charge pump control circuit configured to determine a magnitude difference between said first intrinsic magnitude and said second intrinsic magnitude and configured to generate a bias control signal having a voltage level corresponding to said determined magnitude difference,
   wherein said charge pump circuit is further configured to generate a bias current in response to said bias control signal such that said bias current is combined with one of the intrinsic positive current component and said intrinsic negative current component to generate a combined current component, and such that a combined magnitude of said combined current component is equal to said intrinsic magnitude of the other of said intrinsic positive current component and said intrinsic negative current component.

2. The PLL circuit of claim 1, further comprising:
   a capacitive circuit coupled to said pump output terminal and configured to generate a controlled voltage in response to the pump output current;
   a voltage controlled oscillator (VCO) coupled to said capacitive circuit and configured to generate said PLL output signal such that said output phase is adjusted in accordance with said controlled voltage; and
   a feedback circuit configured to transmit a feedback signal, which corresponds with the output phase, to the phase frequency detector.

3. The PLL circuit of claim 1,
   wherein the phase frequency detector is configured to assert a first pump control voltage when said output phase leads the input phase and to assert a second pump control voltage when said output phase lags the input phase, and
   wherein the charge pump circuit comprises:
   a first pull-up switch configured to apply said intrinsic positive current component on said pump output terminal when said first pump control voltage is asserted;
   a first pull-down switch configured to apply said intrinsic negative current component on said pump output terminal when said second pump control voltage is asserted; and one or more bias current transistors operably configured to generate said bias current in response to the bias control signal generated by the bias generator.

4. The PLL circuit of claim 3, wherein said one or more bias current transistors comprises a pull-up transistor coupled between a high voltage source and said pump output terminal.

5. The PLL circuit of claim 1, wherein the charge pump control circuit comprises: a difference measurement circuit configured to calculate and store a digital converter code value corresponding to the determined magnitude difference between said first intrinsic magnitude of said intrinsic positive current component and said second intrinsic magnitude of said intrinsic negative current component; and
   a bias generator configured to generate said bias control signal in accordance with said digital converter code value.

6. The PLL circuit of claim 5, further comprising a capacitive circuit coupled to said pump output terminal and configured to generate a controlled voltage in response to the pump output current,
   wherein the charge pump control circuit is further configured to control at least one of said phase frequency detector and said charge pump during a calibration period such that said charge pump simultaneously applies said intrinsic positive current component, said intrinsic negative current component, and a time-varying bias current to said pump output terminal,
   wherein the difference measurement circuit is configured to measure said controlled voltage generated by said capacitive circuit during said calibration period.

7. The PLL circuit of claim 5, wherein said bias generator comprises a digital-to-analog converter configured to generate said bias control signal by way of converting said digital converter code value to an associated voltage level.

8. The PLL circuit of claim 6, wherein said difference measurement circuit further comprises:
   an envelope detector coupled to the capacitive circuit and configured to generate an envelope signal based on said controlled voltage; and
   a comparator configured to compare the envelope signal with said controlled voltage.

9. The PLL circuit of claim 8,
   wherein said difference measurement circuit further comprises an amplifier coupled to the capacitive circuit and configured to amplify the controlled voltage, and
   wherein the comparator is configured to indicate when the envelope signal deviates from said amplified controlled voltage.

10. The PLL circuit of claim 8, further comprising a lock circuit configured to generate a frequency lock signal having a first value when said output phase of the PLL output signal matches the input phase of the applied input signal,
    wherein the difference measurement circuit further comprises a counter configured to increment in accordance with changes in the current level of said bias current, and
    wherein the difference measurement circuit is configured to determine said digital adjustment code value based on one-half of a count value accrued on the counter between a first time when the frequency lock signal switches to said first value and the controlled voltage has a first value, and a second time when the comparator indicates the controlled voltage has returned to the first value.

11. The PLL circuit of claim 5, wherein the charge pump control circuit comprises a calibration charge pump configured to generate to generate a calibration pump output current on a calibration pump output terminal such that said calibration pump output current includes a duplicate intrinsic positive current component having said first intrinsic magnitude and a duplicate intrinsic negative current component having said second intrinsic magnitude;
    wherein said charge pump control circuit is further configured such that said calibration pump output current includes a combination of said duplicate intrinsic positive current component, said intrinsic negative current component, and a time-varying bias current during a calibration period,
    wherein the difference measurement circuit is configured to measure a controlled voltage generated in response to the calibration pump output current during said calibration period.

12. A phase locked loop (PLL) circuit configured to generate an output signal such that an output phase of the output signal matches the input phase of an input signal, the PLL circuit comprising:
    a charge pump circuit configured to generate an output current including one of a positive current component and a negative current component when said at least one pump control voltage has the second value, wherein said charge pump circuit is further configured such that one of a first magnitude of said positive current component and a second magnitude of said negative current component is adjusted to include a bias current; and
    a charge pump control circuit configured to generate a pump bias voltage having a voltage level that varies in accordance with a digital value of a stored digital adjustment code,
    wherein said charge pump control circuit is further configured to transmit said pump bias voltage to said charge pump circuit such that said bias current has a current level that varies in accordance with the voltage level of said pump bias voltage.

13. A method for adjusting a charge pump output current in a phase locked loop circuit such that a magnitude difference between a positive current component and a negative current component forming said charge pump output current during normal PLL operating periods is minimized, the method comprising:
    controlling a charge pump during a calibration period to generate a time-varying calibration current by simultaneously applying said intrinsic positive current component, said intrinsic negative current component and an incrementally changing bias current to a pump output terminal of said charge pump;
    measuring a time-varying calibration controlled voltage generated in response to said time-varying calibration current during said calibration period;
    determining a current adjustment amount by detecting an inflection point of the time-varying calibration controlled voltage, and identifying an amount of said bias current applied to pump output terminal at the time of said inflection point; and
    adjusting the charge pump output current such that said positive current component is increased by the determined current adjustment amount during said normal operating period.

14. The method of claim 13, wherein controlling the charge pump during the calibration period comprises:

coupling the pump output terminal to a high voltage source by way of a pull-up switch such that said intrinsic positive current component passes through the pull-up switch;

coupling the pump output terminal to a low voltage source by way of a pull-down switch such that said intrinsic negative current component passes through the pull-down switch; and utilizing an incrementally changing bias voltage to control a transistor coupled between said pump output terminal and one of said high voltage source and said low voltage source such that said transistor passes said incrementally changing bias current to the pump output terminal in response to said incrementally changing bias voltage.

15. The method of claim 14, wherein adjusting the charge pump such that said positive current component is increased by the determined current adjustment amount during said normal operating period comprises utilizing a bias voltage to control said transistor such that a bias current equal to the determined current adjustment amount is passed through said transistor during said normal operating period.

16. The method of claim 15, further comprising storing a digital adjustment code having a digital value corresponding to said determined current adjustment amount, wherein utilizing said bias voltage to control said transistor during said normal operating period comprises generating said bias voltage in accordance with said stored digital adjustment code.

17. The method of claim 16, generating said bias voltage comprises utilizing a digital-to-analog converter configured to receive said stored digital adjustment code and to generate said bias voltage at a voltage level corresponding to said digital value of said digital adjustment code.

18. The method of claim 16, wherein determining the current adjustment amount comprises incrementing a counter value in accordance with incremental changes to the incrementally changing bias current, and utilizing said counter value to determine said digital value of said digital adjustment code.

19. The method of claim 18, wherein determining the current adjustment amount comprises applying said time-varying calibration controlled voltage to an envelope detector, and comparing an output from said envelope detector with said time-varying calibration controlled voltage.

20. The method of claim 13,
wherein adjusting the charge pump output current during said normal operating period comprises adjusting a primary charge pump such that said positive current component generated by said primary charge pump is increased by the determined current adjustment amount, and wherein said controlling a charge pump during the calibration period comprises controlling a secondary charge pump.

* * * * *